United States Patent [19]
Zuniga et al.

[11] Patent Number: 6,064,686
[45] Date of Patent: May 16, 2000

[54] ARC-FREE ELECTRON GUN

[75] Inventors: Luis A. Zuniga, Grass Valley; Michael E. LaFrance, Columbia; Larry F. Willitzer, Rodeo; Christopher S. Johnson, Sunnyvale, all of Calif.

[73] Assignee: TFI Telemark, Fremont, Calif.

[21] Appl. No.: 09/283,898

[22] Filed: Mar. 30, 1999

[51] Int. Cl.⁷ .......................... H01J 37/305; B23K 15/00
[52] U.S. Cl. .......................... 373/13; 373/14; 219/121.27
[58] Field of Search ................... 373/10, 11, 12, 373/13, 14; 219/121.12, 121.16, 121.18, 121.19, 121.27, 121.33, 121.34; 313/446, 448, 456

[56] References Cited

U.S. PATENT DOCUMENTS

| | | | |
|---|---|---|---|
| 2,981,823 | 4/1961 | Candidus | 219/121.27 |
| 3,177,535 | 4/1965 | Hanks . | |
| 3,286,021 | 11/1966 | Koch | 219/121.27 |
| 3,535,428 | 10/1970 | Hanks . | |
| 3,582,529 | 6/1971 | Anderson et al. . | |
| 3,710,072 | 1/1973 | Shrader et al. | 219/121.27 |
| 3,801,719 | 4/1974 | Pudliner | 373/13 |
| 3,883,679 | 5/1975 | Shrader et al. | 373/13 |
| 4,064,352 | 12/1977 | Mann | 373/13 |
| 5,111,022 | 5/1992 | Harper et al. | 219/121.33 |
| 5,182,488 | 1/1993 | Hill et al. | 313/446 |
| 5,216,690 | 6/1993 | Hanks . | |
| 5,338,913 | 8/1994 | Finn et al. . | |
| 5,418,348 | 5/1995 | Tsujimoto et al. | 219/121.27 |

OTHER PUBLICATIONS

Sales brochure, "Single Crucible Electron Beam Source Model SFIH–270–2", 2 pages.
Sales brochure, "Electron Beam Turret SuperSource Model STIH–270–2M", 4 pages.

*Primary Examiner*—Tu Ba Hoang
*Attorney, Agent, or Firm*—Limbach & Limbach

[57] ABSTRACT

An electron gun that prevents undesirable arcing by providing an improved electrostatic field that generates a confined electron stream, an improved magnetic field that directs the confined electron stream to a crucible with minimal divergence, and an improved insulation on high voltage leads. The improved electrostatic field is provided by a cathode plate disposed adjacent to a filament and forming a cathode window aligned to the filament. An anode plate disposed adjacent to the cathode plate forms an anode window aligned to the cathode window. The cathode plate and anode plate form an electrostatic field and lensing effect that directs electrons emitted from the filament through the cathode and anode windows with minimal divergence. The improved magnetic field is provided by a magnet having a pair of poles, a pair of extension plates each extending from the magnet poles, and a plurality of extension members that extend from the extension plates toward the path of the electron stream. The magnet, pair of extension plates and plurality of extension members provide a uniform magnetic field along the electron stream path to guide the electron stream to the crucible with a minimum of divergence. The improved insulation on high voltage leads is possible because a cooling fluid jacket member forms first channels through which insulated high voltage wires pass that connect to the filament and anode/cathode plates, a second channel through which cooling fluid flows in order to cool the first channels and the wires therein.

21 Claims, 7 Drawing Sheets

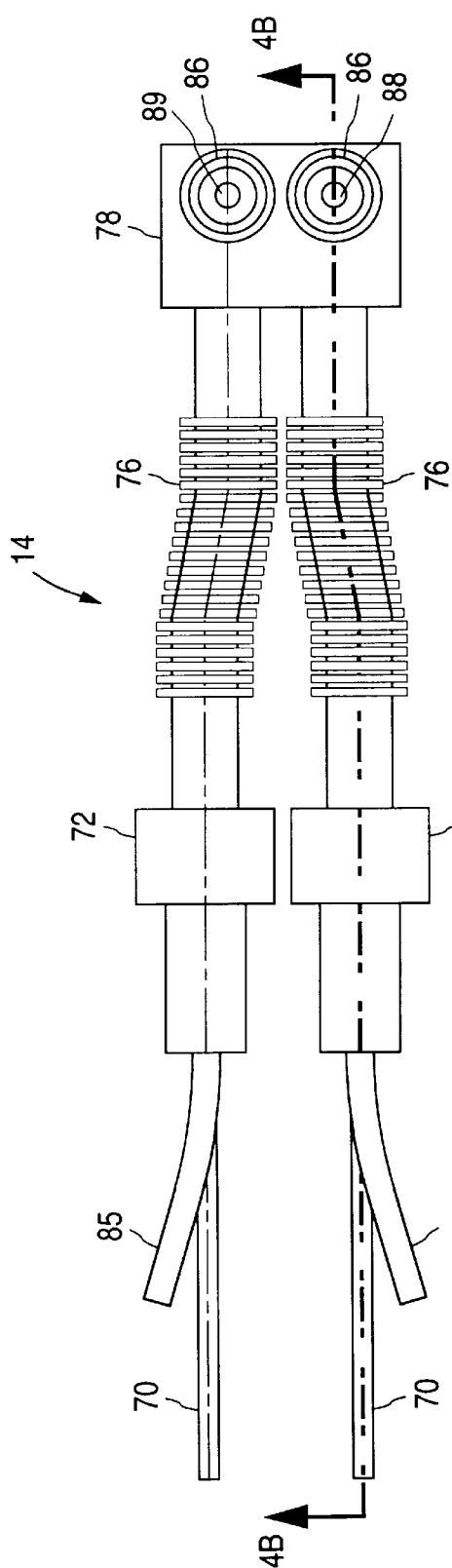
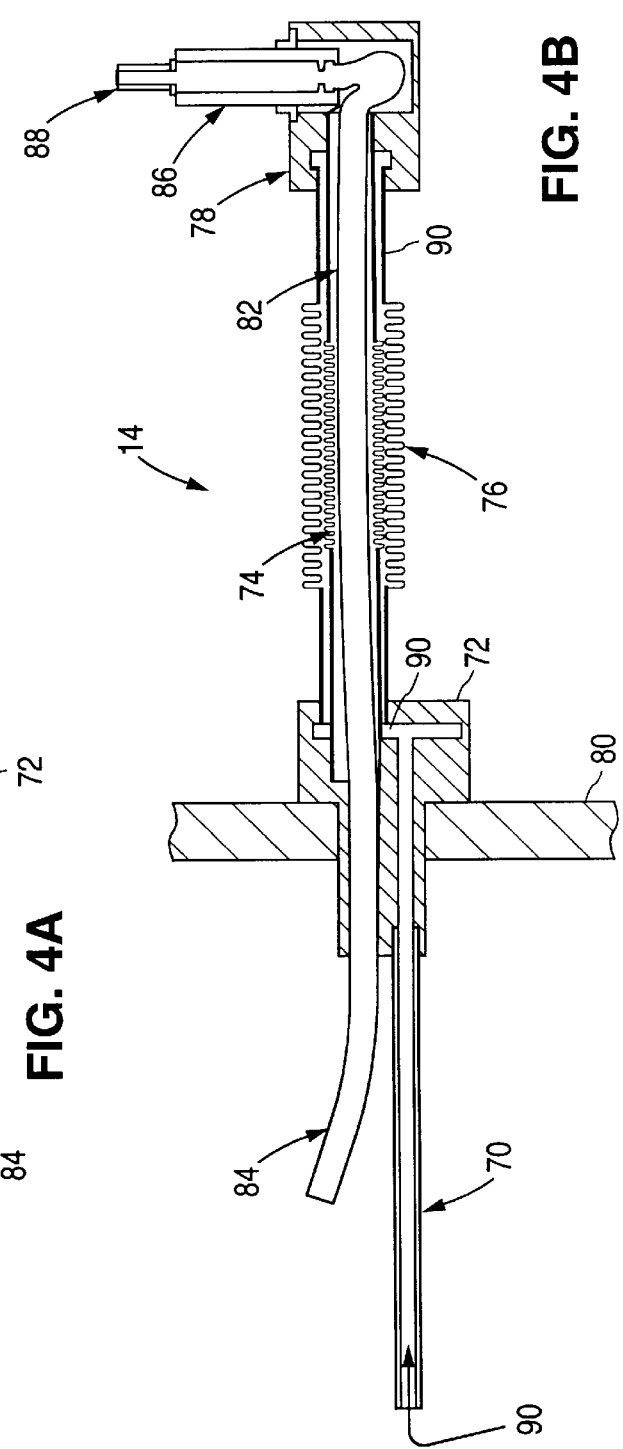
FIG. 4A
FIG. 4B

ARC-FREE ELECTRON GUN

FIELD OF THE INVENTION

The present invention relates to an arc free, liquid cooled electron gun (E-gun).

BACKGROUND OF THE INVENTION

E-guns are used for various applications, and particularly for vapor deposition processes inside a sealed vacuum chamber. Such E-guns typically include an electron emitting source (emitter) for emitting a stream of electrons, high voltage leads to operate the emitter, a crucible for holding evaporant material, and a magnet for creating a magnetic field that directs the stream of electrons from the emitter onto the surface of the evaporant material. The incident electron stream evaporates the material to fill the chamber with a gaseous cloud for deposition onto substrates positioned in the chamber. U.S. Pat. Nos. 3,710,072 and 5,111, 022 show various details of prior art E-guns.

One problem with such E-guns is arcing that occurs during operation, especially as the pressure inside the sealed vacuum chamber increases. More specifically, as the material in the crucible evaporates, a portion of it decomposes to positive ions plus some gas. These positive ions are emitted with a certain kinetic energy into the magnetic field, which guides the ions back toward the emitter along a similar path taken by the electron stream. Some of these ions can enter and damage the emitter.

Another problem caused by the positive ions in the chamber involves the high voltage leads, which extend from the chamber wall to the E-gun. These leads are typically bare high voltage conductors. Positive ions floating in the chamber between these conductors can cause arcing between the conductors and ground. Minimizing sharp corners on the conductors does not completely solve this arcing problem. Further, it is difficult to electrically insulate these leads because most insulating materials cannot withstand the high chamber temperatures that exist during vapor deposition.

One solution is proposed in U.S. Pat. No. 5,216,690 (issued to Hanks), in which a shield is added that surrounds all of the high voltage surfaces. The shield is grounded, and spaced from the HV surfaces by a distance that is below the mean free path of electrons at the highest pressure anticipated. The electrons making the transit, although accelerating quickly going from -KV cathode surface to nearby ground, have minimal ion collision probability over the entire distance. The electrons merely transfer to ground a minimal amount of energy. This suppresses arc-downs and glow discharges. However, the drawback to this type of e-gun is that the rigid ground shielded high voltage leads make it extremely difficult to install the device.

There is a need for an arc-free electron E-gun for vapor deposition processes.

SUMMARY OF THE INVENTION

The present invention solves the aforementioned problems by providing an E-gun with an improved electrostatic field, an improved magnetic field, and/or an improved flexible insulation on high voltage leads.

The electron gun of the present invention includes an emitter assembly and a magnet assembly. The emitter assembly has a filament that when heated emits electrons, a cathode plate disposed adjacent to the filament and forming a cathode window aligned to the filament, and an anode plate disposed adjacent to the cathode plate and forming an anode window aligned to the cathode window. The cathode plate and anode plate are connectable to a voltage source for forming an electrostatic field that directs the emitted electrons into an electron stream that traverses through the cathode window and the anode window. The magnet assembly includes a crucible, and a magnet that generates a magnetic field for guiding the electron stream along a path to the crucible. The anode window, cathode window and filament are aligned with each other to form an electrostatic lens that minimizes the divergence of the electron stream.

In another aspect of the present invention, the electron gun is mountable to a vacuum deposition chamber for evaporating material therein, and includes an emitter assembly and a magnet assembly. The emitter assembly has a filament that when heated emits electrons, a cathode plate disposed adjacent to the filament and forming a cathode window aligned to the filament, and an anode plate disposed adjacent to the cathode plate and forming an anode window aligned to the cathode window. The cathode plate and anode plate are connectable to a voltage source and aligned to each other and the filament for forming an electrostatic field that acts as a lens to focus the emitted electrons into an electron stream with a minimized divergence that traverses through the cathode window and the anode window. The magnet assembly includes a crucible, a magnet having a pair of poles that generates a magnetic field for guiding the electron stream along a path to the crucible, a pair of extension plates each extending from a different one of the poles of the magnet, and a plurality of extension members that extend from the extension plates toward the path of the electron stream. The magnet, pair of extension plates and plurality of extension members provide a uniform field along the electron stream path so that the electron stream is guided to the crucible with a minimum of divergence.

In yet another aspect of the present invention, the electron gun includes an emitter assembly, a magnet assembly and an ion trap plate. The emitter assembly includes a filament that when heated emits electrons, a cathode plate disposed adjacent to the filament, and an anode plate disposed adjacent to the cathode plate. The cathode plate and anode plate are connectable to a voltage source for forming an electrostatic field that directs the emitted electrons into an electron stream. The magnet assembly includes a crucible, and a magnet that generates a magnetic field for guiding the electron stream along a path to the crucible. The ion trap plate is electrically connectable to the voltage source. The anode plate includes an anode window formed therein that is aligned to the ion trap plate that attracts positive ions during operation.

In yet one more aspect of the present invention, the electron gun includes an emitter assembly, a magnet assembly, a pair of insulated wires, and a cooling fluid jacket. The emitter assembly includes a filament that when heated emits electrons, a cathode plate disposed adjacent to the filament, and an anode plate disposed adjacent to the cathode plate. The cathode plate and anode plate are connectable to a voltage source for forming an electrostatic field that directs the emitted electrons into an electron stream. The magnet assembly includes a crucible, and a magnet that generates a magnetic field for guiding the electron stream along a path to the crucible. The pair of insulated wires are electrically connected to the filament for passing electrical current through and heating the filament. The cooling fluid jacket member forms a first channel through which at least part of one of the wires passes and a second channel through which a cooling fluid flows.

Other objects and features of the present invention will become apparent by a review of the specification, claims and appended figures.

BRIEF DESCRIPTION OF THE DRAWINGS

FIG. 4A is a top view of the high voltage lead assembly of the present invention.

FIG. 4B is a side cross-sectional view of the high voltage lead assembly of the present invention.

DETAILED DESCRIPTION OF THE PREFERRED EMBODIMENTS

The present invention is an arc-free electron gun (E-gun) for vapor deposition processes, which prevents arcing by providing an improved electrostatic field, an improved magnetic field, and an improved insulation on high voltage leads.

Figure 1:
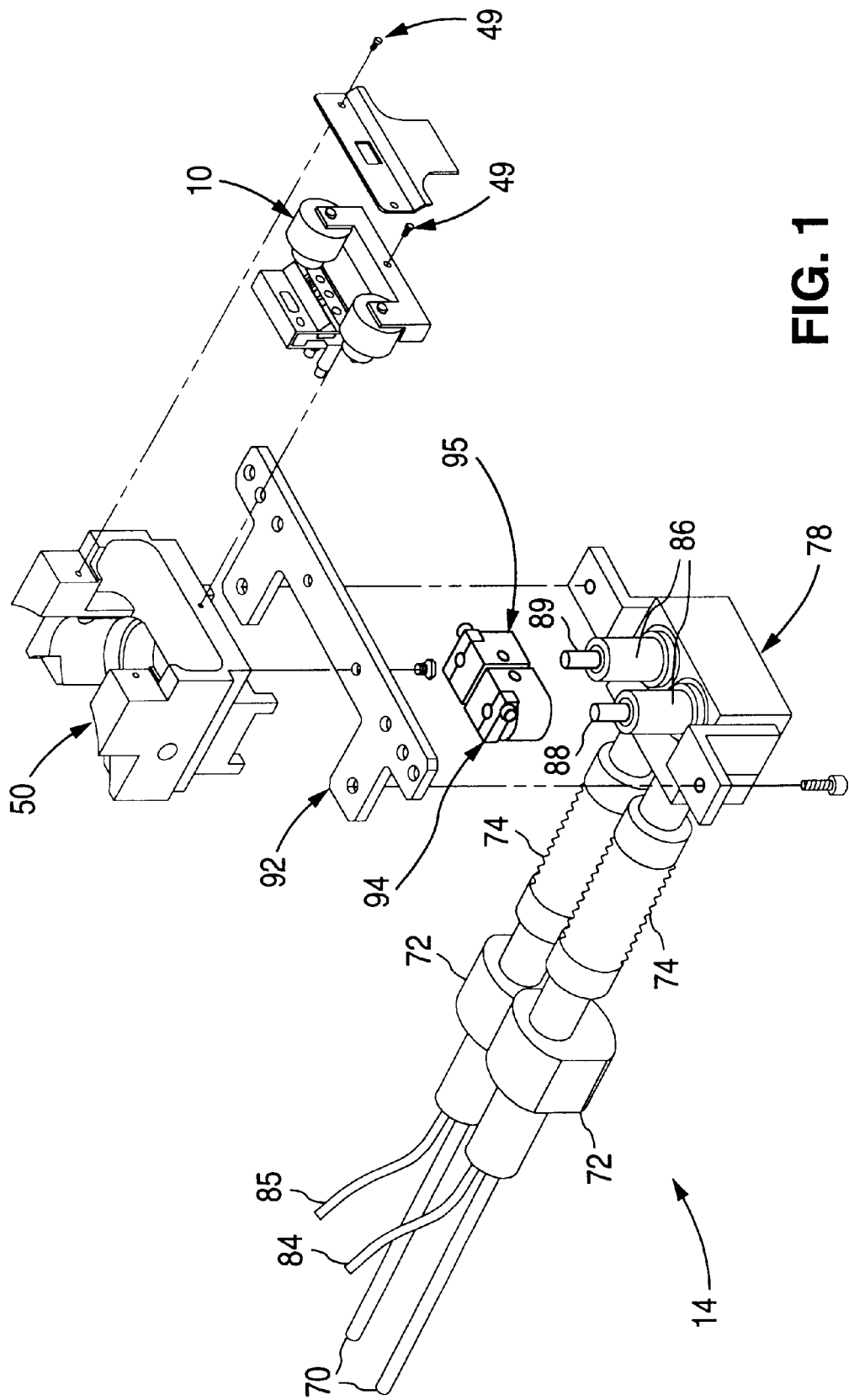
FIG. 1 is a partial exploded view of the electron gun of the present invention.
Figure 3C:
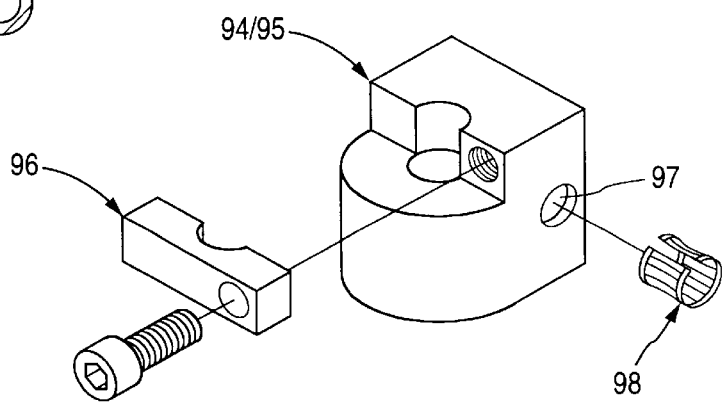
FIG. 3C is an exploded view of the adapter block of the present invention.
Figure 3A:
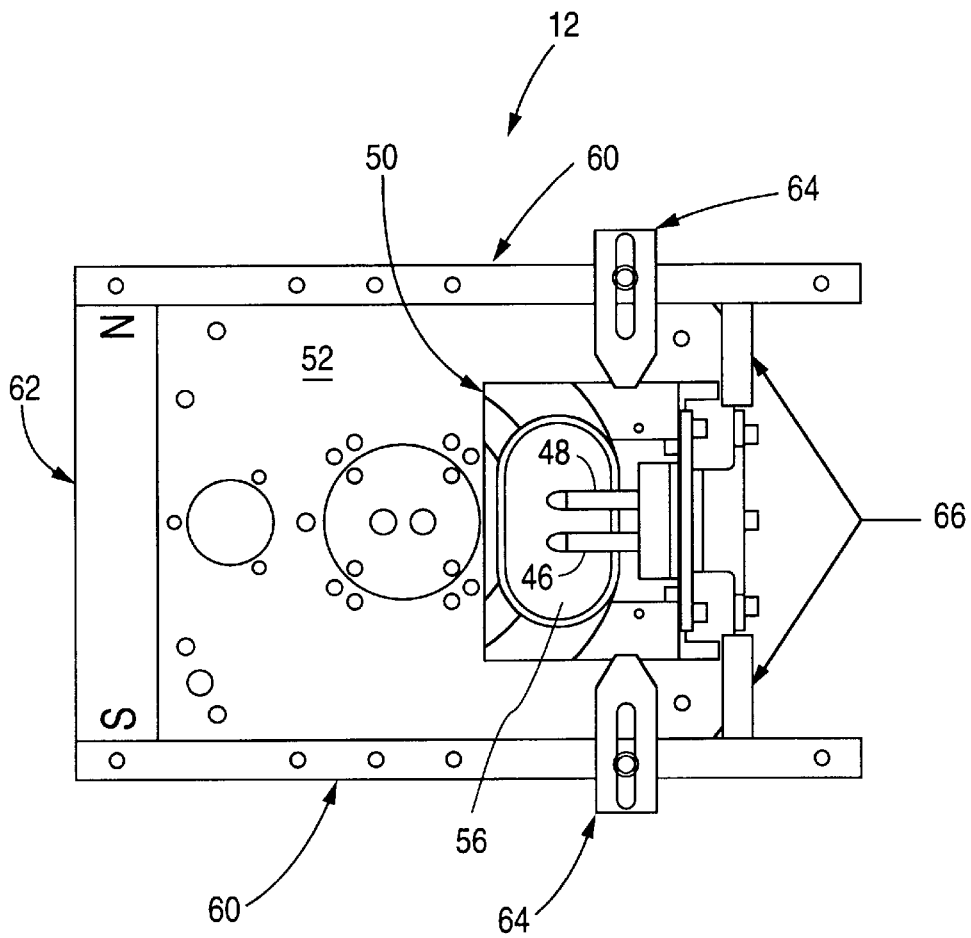
FIG. 3A is a top view of the magnet assembly of the present invention.

The arc-free E-gun of the present invention is illustrated in FIGS. 1 and 3A, and includes an electron emitter assembly 10, a magnet assembly 12, and a high voltage lead assembly 14.

Figure 2A:
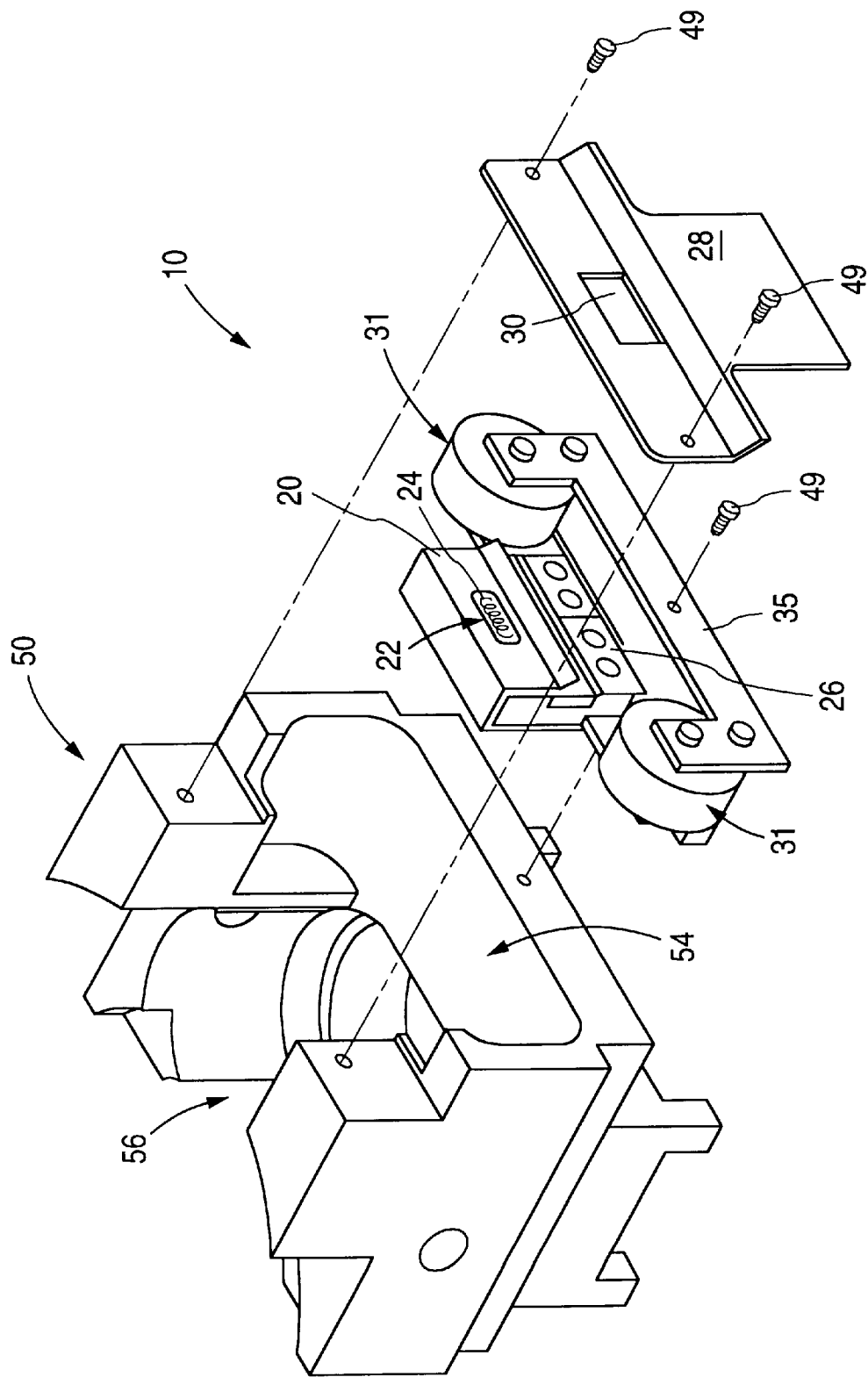
FIG. 2A is a partially exploded view of the emitter assembly and emitter block of the present invention.
Figure 2B:
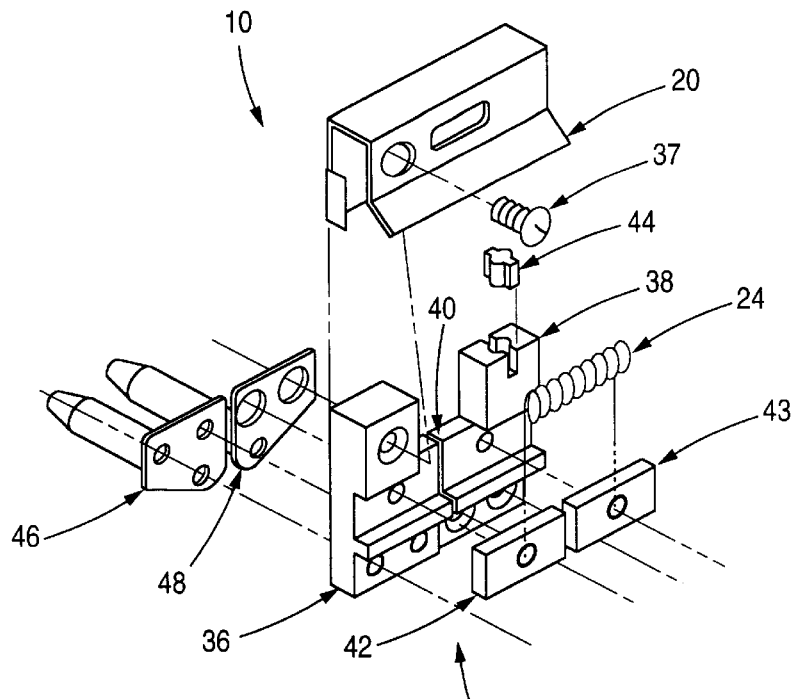
FIG. 2B is an exploded view of the emitter assembly of the present invention.

The electron emitter assembly 10 is better illustrated in FIGS. 2A and 2B, and includes a shaped cathode plate 20 with a cathode window 22. The cathode plate 20 surrounds and forms an enclosure around a filament 24 located adjacent the cathode window 22. The cathode plate 20 is mounted to a cathode assembly 26. An anode plate 28 with an anode window 30 is mounted to emitter block 50. The relative alignment of the cathode window 22, anode window 30 and filament 24 to each other is described later with reference to FIG. 6.

Figure 2C:
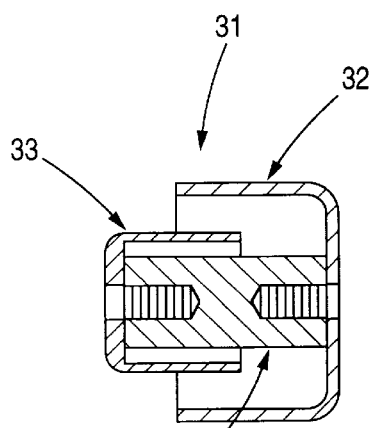
FIG. 2C is a side cross-sectional view of the insulator assemblies of the present invention.

The cathode assembly 26 is mounted to the emitter block 50 by electrical insulator assemblies 31 and a mounting plate 35. The insulator assemblies 31, better illustrated in FIG. 2C, electrically insulate the cathode assembly 26 from the emitter block 50 to which it is attached. Insulator assemblies 31 include an outer cup shaped HV shield 32, and an inner cup shaped HV shield 33, which are connected together in an overlapping fashion by an electrical insulator member 34. The open end of cup shaped shield 32 overlaps with the insulator member 34 and the open end of the inner cup shaped shield 33.

The cathode assembly 26 includes two cathode blocks 36 and 38 separated by an air gap or insulating member 40, as illustrated in FIG. 2B. The filament 24 is mounted between the cathode blocks 36/38 by filament mounting plates 42/43. The cathode plate 20 is mounted to and is electrically connected with cathode block 36 by a screw 37. However, cathode plate 20 is electrically insulated from cathode block 38 by an insulator member 44 attached to the top of the cathode block 38. A pair of cathode leads 46 and 48 are attached to the cathode blocks 36 and 38 respectively.

Figure 3B:
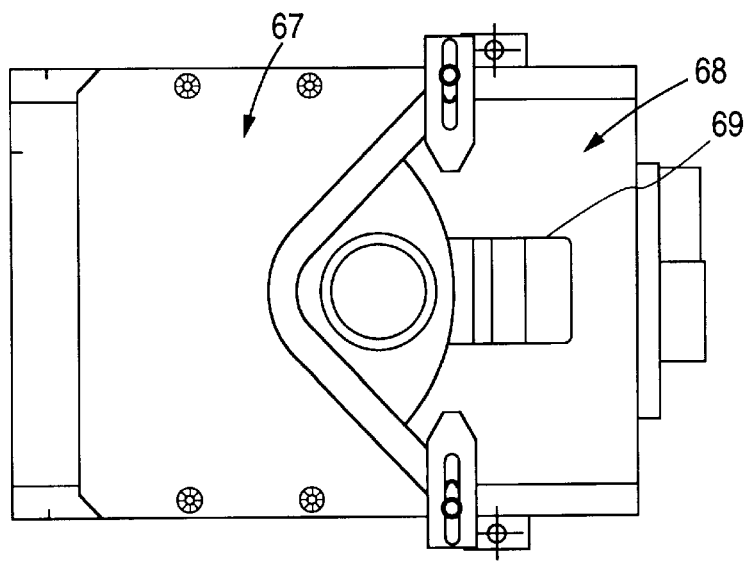
FIG. 3B is a top view of the magnet assembly with the cover plates in place.

The emitter assembly 10 is mounted to the magnet assembly 12, which includes a emitter block 50 and a magnet support member 52, as illustrated in FIGS. 2A and 3A. Screws 49 electrically connect the mounting plate 35 and anode plate 28 to the emitter block 50. The emitter block 50 includes an emitter recess 54 for housing the emitter assembly 10 and a crucible recess 56 into which the cathode leads 46/48 extend. The magnet support member 52 supports a pair of opposing magnet extension plates 60, with a magnet 62 extending therebetween at one end and the emitter assembly 10 and emitter block 50 disposed therebetween near the opposite end so as to create a magnetic field M around the emitter assembly 10 and emitter block 50 (see also FIG. 5). A pair of pole pieces 64 are attached to extension plates 60 and extend toward emitter block 50. In addition, a pair of auxiliary pole pieces 66 are attached to extension plates 60 and extend toward the anode plate 28. The pole pieces 64 and auxiliary pole pieces 66 act to shape the magnetic field M around emitter assembly 10 and crucible 58 for superior electron stream confinement as described in further detail below. A cover plate 67 over the magnet assembly 12 and another cover plate 68 over the emitter assembly 10 protect the E-gun from positive ions and other matter floating in the chamber, as illustrated in FIG. 3B. An aperture 69 is formed in the cover plate 68 through which the electron stream 100 flows. A crucible 58 is disposed in or above the recess 56.

The high voltage lead assembly 14 is best illustrated in FIGS. 4A and 4B, and includes water lines 70 connected to mounting blocks 72, which are connected to inner and outer bellows 74 and 76 (preferably made of stainless steel), which are in turn connected to an insulator block 78. The mounting blocks 72 mount through holes in side wall 80 of a vapor deposition chamber to support the E-gun of the present invention. The mounting blocks 72, inner bellows 74 and insulator block 78 form a pair of wire channels 82 through which a pair of insulated wires 84/85 pass from outside the chamber to the insulator block 78. From the insulator block 78, the wires 84/85 pass upwards through insulator posts 86 (which are made of an electrically non-conducting material) and terminate at high voltage leads 88/89 respectively. Water lines 70, mounting blocks 72, inner/outer bellows 47/76 and insulator block 78 form a water path 90, where cooling water enters through one of the water lines 70, passes through one of the mounting blocks 70, between one pair of inner/outer bellows 74/76, through the insulator block 78, and out through the other pair of inner/outer bellows 74/76, mounting block 72 and water line 70.

Emitter block 50 is mounted to the top of insulator block 78 with a mounting plate 92 therebetween (see FIG. 1). A pair of adaptor blocks 94/95 connect between the high voltage leads 88/89 and the respective cathode leads 46/48. More specifically, an adapter block 94/95 is illustrated in FIG. 3C, and includes a clamp member 96 that clamps to one of the high voltage leads 88/89, and a cathode lead socket 97 for receiving one of the cathode leads 46/48. An annular gold spring 98 can be used in socket 97 for making better electrical contact between the adaptor block 94/95 and the cathode lead 46/48 engaged therein. Cathode leads 46/48 removably plug into sockets 97 so that the emitter assembly 10 can be easily removed in its entirety for maintenance (such as replacing the filament 24).

Assuming that the chamber wall 80 is at system ground potential, then so too are mounting blocks 72, bellows 74/76, insulator block 78, mounting plate 92, emitter block 50 and anode plate 28, which are all made of conductive metal and electrically connected together. Assuming a voltage is placed on wire 84, that same voltage is present on lead 88, adaptor block 94, cathode lead 46, cathode block 36, cathode plate 20 and filament mounting plate 42, which are all electrically conductive and connected together. Assuming another voltage is placed on wire 85, that same voltage is present on lead 89, adaptor block 95, cathode lead 48, cathode block 38, and filament mounting plate 43, which are all electrically conductive and connected together.

During operation, cooling water is circulated through water path 90. The flowing cooling water keeps the temperature of various E-gun elements at a safe temperature even if the chamber interior reaches temperatures that would otherwise destroy high-temperature intolerant elements. For example, the flowing cooling water keeps the insulation around the wires 84/85 from being damaged by high temperatures. The presence of the insulation prevents arcing between the two wires 84/85 and ground. The cooling water also keeps the insulating block 78 and high voltage leads 88/89 from melting under the high chamber temperatures.

To create a stream of electrons for evaporating the material in the crucible 58, a voltage $V_1$ is impressed onto wires 84 and 85 by the secondary winding of a 0–7 VAC isotransformer. This allows the AC current through the filament to be raised and lowered while keeping the filament at a negative DC potential $V_1$. The AC current flow through filament 24 raises the filament temperature and drives off electrons from the filament surface in all directions.

Figure 5:
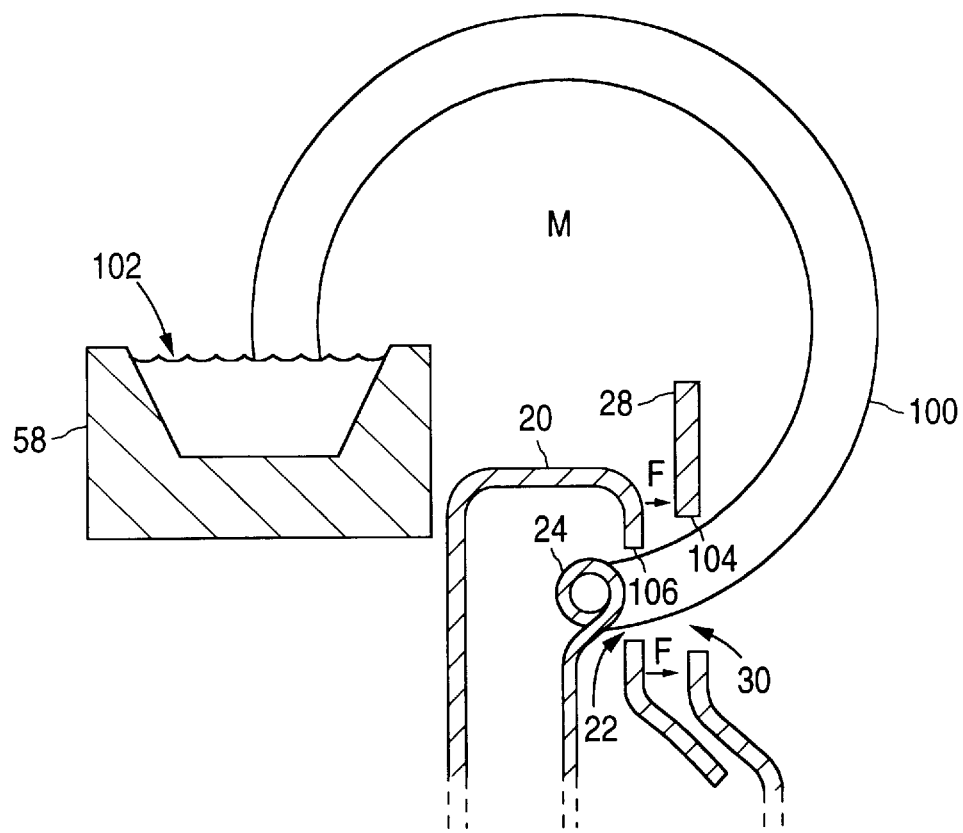
FIG. 5 is a partial side cross-section view of the emitter assembly and crucible of the present invention.

An electrostatic field F is created by cathode plate 20 (which is at a voltage of $V_1$) and anode plate 28 (which is at system ground potential). Voltage $V_1$ is below the system ground potential to repel the electrons emitted by filament 24 through cathode window 22 and into a confined stream 100, as illustrated in FIG. 5. The electrons in stream 100 are accelerated by the electrostatic field F until the electron stream 100 passes through anode window 30.

The magnetic field M, generated by the magnet assembly 12 and surrounding emitter assembly 10, induces a force on the moving electron stream 100 in a direction perpendicular to the direction of motion, thus causing the electron stream 100 to move in a circular path until the electrons strike the evaporant 102 in the crucible 58. The electron stream 100 incident on the crucible 58 evaporates the material 102 therein and forms a gas cloud in the chamber.

Figure 6:
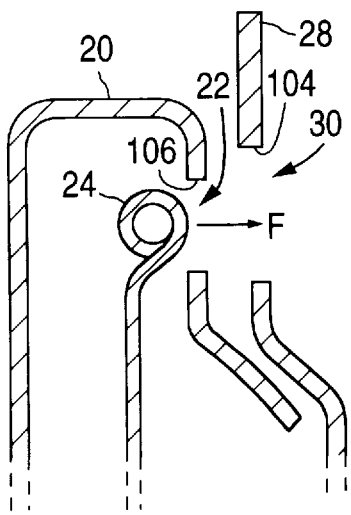
FIG. 6 is a partial side cross-section view of the emitter assembly of the present invention.

The relative alignment of cathode plate 20 and anode plate 28 is illustrated in FIG. 6. Cathode and anode plates 20/28 are spaced from each other to produce the electrostatic field F near filament 24. Cathode window 22 and anode window 30 are aligned to each other and to filament 24 to form an electrostatic lens for the electrons emitted by filament 24 and forming electron stream 100. Electrons emitted by filament 24 are trapped by cathode plate 20 and cathode blocks 36/38. Cathode window 22 is the only exit for these trapped electrons, which causes a more defined stream path for the electrons.

The windows 22/30 need to be as small as possible to prevent ions from passing therethrough and damaging the filament, but not too small so as to impede the electrons in stream 100. Therefore, the sizes of the windows 22/30 are just slightly larger than filament 28 to freely allow electron stream 100 to pass therethrough. In addition, the upper edge 104 of anode window 30 is higher than the upper edge 106 of cathode window 22 by a predetermined amount to take into account the vertical displacement of the electrons caused by magnetic field M as the electrons travel between the cathode plate 20 and anode plate 28. Without this offset between window edges 104/106, the upper edge 104 of anode plate window 30 would block part of the electron stream 100 resulting in a scattered electron stream 100 and a burned anode plate 28.

Arcing in the above described E-gun is prevented in several ways, which allows arc-free operation of the E-gun at much higher pressures. First, the lensing effect of the cathode/anode windows 22/30 produces a focused electron stream 100 exiting the anode window 30. Second, auxiliary pole pieces 66 and pole pieces 64 are positioned along the electron stream path, thus providing a concentrated and uniform magnetic field along the width of the electron stream 100 to minimize any divergence thereof. The focused electron stream 100, which is produced by the lensing effect of electrostatic field F and guided by the shaped magnetic field M, is maintained in a close parallel circular stream with a concentrated footprint as it strikes the crucible. Third, cathode and anode plates 20/28 with windows 22/30 formed therein prevent positive ions, which are emitted from the evaporated material and directed back toward the electron emitter 10 by magnetic field M, from reaching and damaging the filament 24 and cathode plate 20. Since these ions have much greater mass than electrons, their radius of curvature under the influence of magnetic field M will be larger than that of the electron stream 100, making most of the ions strike the anode plate 28 below anode window 30. Fourth, outer cup shaped HV shields 32, which are maintained at system ground potential along with mounting plate 35 and anode plate 28 mounted adjacent thereto, shield the insulator members 34 and inner cup shaped HV shields 33, which are held at a large negative electric potential, from the positive ions. Thus, the elements exposed to incoming positive ions (anode plate 28, mounting plate 35, HV shields 32 and emitter block 50) are all at system ground (instead of significantly below system ground). Fifth, cover plates 67 and 68 are placed over the magnetic assembly to prevent positive ions and other contaminants from accessing the emitter assembly 10. Sixth, arcing between wires 84/85 is prevented by the presence of insulation layers around wires 84/85, the use of which is made possible by the cooling fluid flowing through water path 90. Otherwise, the insulation would be damaged and fail due to the extreme temperatures inside the chamber. Seventh, the high voltages from wires 84/85 are not exposed to the chamber, except for at the cathode blocks 36 and filament 24, which are surrounded and protected by cathode plate 20. Surrounding the high voltage wires by the grounded, water cooled bellows prevents positive ions from collecting on the otherwise exposed high voltage wires.

An arc free E-gun according to the present invention has been developed, where the cathode window 22 is 0.04–0.06 inches taller, and 0.08–0.1 inches longer, than the height (0.125 inches) and length (0.775 inches) of filament 24. The anode plate 28 is spaced about 0.100±0.005 inches from the cathode plate 20. The anode window is 0.085–0.095 inches taller, and 0.020 inches longer, than the height and length of cathode window 22. The upper edge 104 of anode window 30 is 0.075 higher than the upper edge 106 of cathode window 22 to accommodate the circular trajectory of the electron stream 100. During operation, an AC current of 0–7 VAC through the filament raises the filament 24 to 850–950° C. to drive off electrons from the filament surface. The electrostatic field is approximately 4–10 KV. It has been found that the above described arc free E-gun can be run at pressures exceeding two orders of magnitude greater than conventional E-guns without incurring any arcing.

Figure 7:
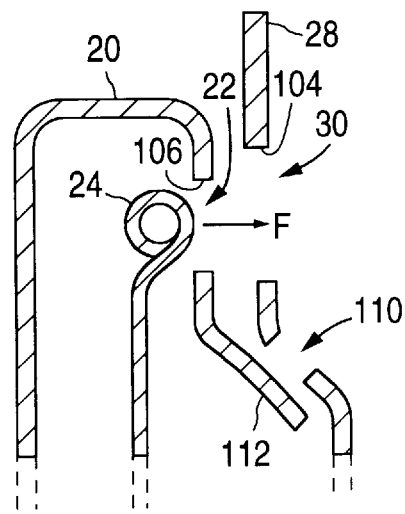
FIG. 7 is a partial side cross-section view of the emitter assembly of an alternate embodiment of the present invention.

FIG. 7 illustrates an alternate embodiment of the present invention, which include an ion trap to attract positive ions incident on anode plate 28 away from anode window 30. A second anode window 110 is formed in anode plate 28, below window 30 and directly opposite flange portion 112 of cathode plate 20. The flange portion 112 of cathode plate 20 will attract positive ions through second window 110, thus reducing the number of ions that travel through window 30 and damage filament 24.

Figure 8A:
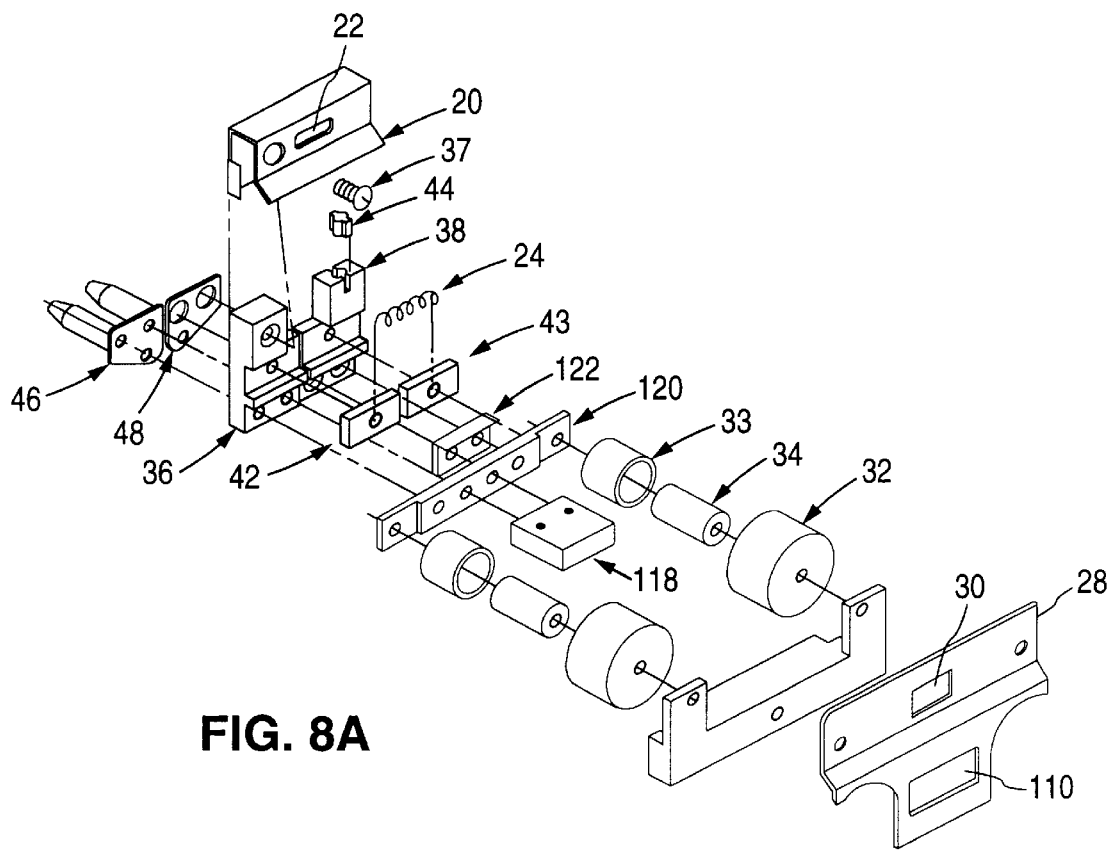
FIG. 8A is an exploded view of a second alternate embodiment of the present invention.
Figure 8B:
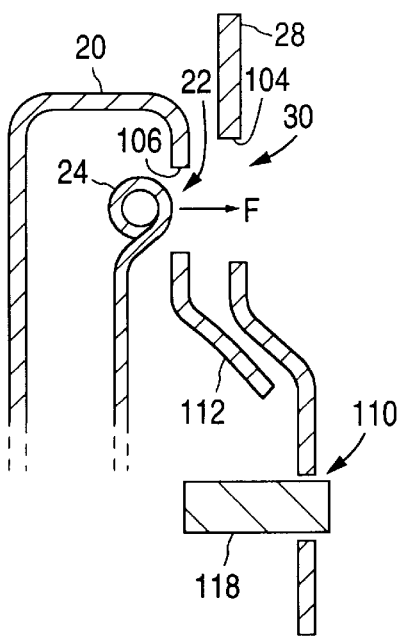
FIG. 8B is a partial side cross-section view of the emitter assembly of the second alternate embodiment of the present invention.

FIGS. 8A and 8B illustrate a second alternate embodiment of the present invention, where an ion trap plate 118 is attached to a mounting plate 120, which in turn is insulated from the filament mounting plate 43 by an insulator 122, but is electrically connected to the filament mounting plate 42. The anode plate 28 is mounted so that the ion trap plate 118 is aligned to the second anode window 110 (which includes aligned adjacent to, protruding into, or protruding through (as shown in FIG. 8B) the anode window 10). The ion trap plate attracts positive ions through second window 110.

During the process of manufacturing optical thin films in a vacuum chamber, a large quantity of positive ions are formed by the collision of highly energetic moving electrons and neutral molecules on the surface of the stationary target material and its evaporation vapor cloud. As the vapor cloud, composed of neutral atoms, propagates through the path of the electron stream, a large number of neutral atoms collide with the electron, loosing electrons from their outer shell, and become positively charged ions. The ions are immediately exposed to the magnetic field used to direct the electron stream. The ions move opposite to the stream of electrons, eventually striking the surface of the electron beam source filament, causing rapid erosion on its surface and hence limiting its performance and lifetime. The second anode window of FIGS. 7 and 8A–B prevent such erosion. The negatively charged flange portion 112 of cathode plate 20 in FIG. 7, or the negatively charged ion trap plate 118 in FIGS. 8A–B, attracts and neutralizes most of the positively charged ions impinging on its surface. The advantage of using the ion trap plate 118 of FIGS. 8A–B instead of the flange portion 112 of FIG. 7 is that the ion trap plate can be made to better tolerate the incoming ions.

It is to be understood that the present invention is not limited to the embodiment described above and illustrated herein, but encompasses any and all variations falling within the scope of the appended claims. For example, inner and outer bellows 74 and 76 can instead be any type of water jacket member, rigid or not, that provides separate concentric or non-concentric wire channels 82 and water paths 90. In addition, while the e-gun is described as being attached to a sidewall of the vacuum deposition chamber, the e-gun of the present invention can be disposed in any position inside the chamber. Further, the voltage source supplying the various voltages discussed above could be a single voltage source device, or separate voltage source devices.

What is claimed is:
1. An electron gun, comprising:
an emitter assembly including:
    a filament that when heated emits electrons,
    a cathode plate disposed adjacent to the filament and forming a cathode window aligned to the filament,
    an anode plate disposed adjacent to the cathode plate and forming an anode window aligned to the cathode window,
    wherein, the cathode plate and anode plate are connectable to a voltage source for forming an electrostatic field that directs the emitted electrons into an electron stream that traverses through the cathode window and the anode window;
a magnet assembly including:
    a crucible,
    a magnet that generates a magnetic field for guiding the electron stream along a path to the crucible;
wherein the anode window, cathode window and filament are aligned with each other to form an electrostatic lens that minimizes the divergence of the electron stream.

2. The electron gun of claim 1, wherein the alignment of the anode window to the cathode window includes having an upper edge of the anode window being offset higher than an upper edge of the cathode window.

3. The electron gun of claim 1, wherein the cathode window has an area that is larger than a parallel cross-sectional area of the filament, and wherein the anode window has an area that is larger than the area of the cathode window.

4. The electron gun of claim 1, further comprising:
a plurality of members coupled to the magnet for shaping the magnetic field along the path of the electron stream.

5. The electron gun of claim 4, wherein the magnet has a pair of poles, and wherein the plurality of members coupled to the magnet includes:
a pair of extension plates each extending from a different one of the poles of the magnet, and
a plurality of extension members that extend from the extension plates toward the path of the electron stream for increasing uniformity of the magnetic field along the path of the electron stream.

6. The electron gun of claim 1, further comprising:
a pair of insulated wires electrically connected to the filament for passing electrical current through and heating the filament; and
a cooling fluid jacket member that forms a first channel through which at least part of one of the wires passes and a second channel through which a cooling fluid flows.

7. The electron gun of claim 6, wherein the cooling jacket member includes:
a first bellows forming the first channel, and
a second bellows concentrically surrounding the first bellows, wherein the second channel is formed between the first bellows and the second bellows.

8. The electron gun of claim 1, wherein the anode plate includes a second anode window formed therein to directly oppose the cathode plate.

9. The electron gun of claim 1, further comprising:
an ion trap plate electrically connectable to the voltage source, wherein the anode plate includes a second anode window formed therein that is aligned to the ion trap plate.

10. The electron gun of claim 1, wherein the cathode plate is shaped to completely surround the filament with a negative potential compared to that of the anode plate for forming the electron stream.

11. An electron gun mountable in a vacuum deposition chamber for evaporating material therein, comprising:
   an emitter assembly including:
      a filament that when heated emits electrons,
      a cathode plate disposed adjacent to the filament and forming a cathode window aligned to the filament,
      an anode plate disposed adjacent to the cathode plate and forming an anode window aligned to the cathode window,
      wherein, the cathode plate and anode plate are connectable to a voltage source and aligned to each other and the filament for forming an electrostatic field that acts as a lens to focus the emitted electrons into an electron stream with a minimized divergence that traverses through the cathode window and the anode window;
   a magnet assembly including:
      a crucible,
      a magnet having a pair of poles that generates a magnetic field for guiding the electron stream along a path to the crucible,
      a pair of extension plates each extending from a different one of the poles of the magnet, and
      a plurality of extension members that extend from the extension plates toward the path of the electron stream,
   wherein the magnet, pair of extension plates and plurality of extension members provide a uniform field along the electron stream path so that the electron stream is guided to the crucible with a minimum of divergence.

12. The electron gun of claim 11, wherein the alignment of the anode window to the cathode window includes having an upper edge of the anode window being offset higher than an upper edge of the cathode window.

13. The electron gun of claim 11, wherein the cathode window has an area that is larger than a parallel cross-sectional area of the filament, and wherein the anode window has an area that is larger than the area of the cathode window.

14. The electron gun of claim 11, further comprising:
   a pair of insulated wires electrically connected to the filament for passing electrical current through and heating the filament; and
   a cooling fluid jacket member that forms a first channel through which at least part of one of the wires passes and a second channel through which a cooling fluid flows.

15. The electron gun of claim 14, wherein the cooling jacket member includes:
   a first bellows forming the first channel, and
   a second bellows concentrically surrounding the first bellows, wherein the second channel is formed between the first bellows and the second bellows.

16. The electron gun of claim 11, wherein the anode plate includes a second anode window formed therein to directly oppose the cathode plate.

17. The electron gun of claim 11, further comprising:
   an ion trap plate electrically connectable to the voltage source, wherein the anode plate includes an anode window formed therein that is aligned to the ion trap plate.

18. The electron gun of claim 11, wherein the cathode plate is shaped to completely surround the filament with a negative potential compared to that of the anode plate for forming the electron stream.

19. An electron gun, comprising:
   an emitter assembly including:
      a filament that when heated emits electrons,
      a cathode plate disposed adjacent to the filament, and
      an anode plate disposed adjacent to the cathode plate,
      wherein, the cathode plate and anode plate are connectable to a voltage source for forming an electrostatic field that directs the emitted electrons into an electron stream;
   a magnet assembly including:
      a crucible, and
      a magnet that generates a magnetic field for guiding the electron stream along a path to the crucible; and
   an ion trap plate electrically connectable to the voltage source, wherein the anode plate includes an anode window formed therein that is aligned to the ion trap plate that attracts positive ions during operation.

20. An electron gun, comprising:
   an emitter assembly including:
      a filament that when heated emits electrons,
      a cathode plate disposed adjacent to the filament, and
      an anode plate disposed adjacent to the cathode plate,
      wherein, the cathode plate and anode plate are connectable to a voltage source for forming an electrostatic field that directs the emitted electrons into an electron stream;
   a magnet assembly including:
      a crucible, and
      a magnet that generates a magnetic field for guiding the electron stream along a path to the crucible;
   a pair of insulated wires electrically connected to the filament for passing electrical current through and heating the filament; and
   a cooling fluid jacket member that forms a first channel through which at least part of one of the wires passes and a second channel through which a cooling fluid flows.

21. The electron gun of claim 20, wherein the cooling jacket member includes:
   a first bellows forming the first channel, and
   a second bellows concentrically surrounding the first bellows, wherein the second channel is formed between the first bellows and the second bellows.

* * * * *